United States Patent
Shimizu et al.

(10) Patent No.: US 9,257,459 B2
(45) Date of Patent: Feb. 9, 2016

(54) IMAGE PICKUP APPARATUS WITH PIXELS THAT INCLUDE AN AMPLIFIER AND METHOD FOR DRIVING THE SAME

(71) Applicant: CANON KABUSHIKI KAISHA, Tokyo (JP)

(72) Inventors: Shinichiro Shimizu, Yokohama (JP); Takashi Matsuda, Yokohama (JP); Yuichiro Yamashita, Sendai (JP); Toshiaki Ono, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 401 days.

(21) Appl. No.: 13/738,878

(22) Filed: Jan. 10, 2013

(65) Prior Publication Data

US 2013/0181117 A1    Jul. 18, 2013

(30) Foreign Application Priority Data

Jan. 18, 2012   (JP) ................. 2012-008201

(51) Int. Cl.
| | | |
|---|---|---|
| H01L 27/146 | (2006.01) | |
| H04N 5/357 | (2011.01) | |
| H04N 5/365 | (2011.01) | |
| H04N 5/376 | (2011.01) | |

(52) U.S. Cl.
CPC ........... *H01L 27/146* (2013.01); *H04N 5/3577* (2013.01); *H04N 5/3658* (2013.01); *H04N 5/376* (2013.01)

(58) Field of Classification Search
CPC combination set(s) only.
See application file for complete search history.

(56) References Cited

U.S. PATENT DOCUMENTS

2006/0279650 A1* 12/2006 Watanabe et al. ............ 348/308
2007/0165117 A1*  7/2007 Toya et al. .................... 348/241

FOREIGN PATENT DOCUMENTS

JP    2001-230974 A    8/2001

* cited by examiner

*Primary Examiner* — Francis M Legasse, Jr.
(74) *Attorney, Agent, or Firm* — Canon USA, Inc. I.P. Division

(57) ABSTRACT

An image pickup apparatus of the present invention includes a clipping circuit that clips the voltage of an input node of an amplifying unit in a pixel. The clipping circuit can operate at least in a time period in which a charge is transferred from a photoelectric conversion unit to the input node of the amplifying unit, and can switch among multiple clipping voltages.

19 Claims, 8 Drawing Sheets

IMAGE PICKUP APPARATUS WITH PIXELS THAT INCLUDE AN AMPLIFIER AND METHOD FOR DRIVING THE SAME

BACKGROUND OF THE INVENTION

1. Field of the Invention

The present invention relates to image pickup apparatuses.

2. Description of the Related Art

A technique is known in which, when a portion of an image pickup area is irradiated with intense light, the voltage of the output node of an amplifying unit in a pixel is clipped so that an influence is not exerted on the area surrounding the portion. For example, in Japanese Patent Laid-Open No. 2001-230974, a configuration is disclosed in which the voltage of the input node of an amplifying unit in a pixel is clipped (for example, see the sixth embodiment).

Through studies carried out by the inventors, a new issue has been found in a configuration for clipping the voltage of the input node of an amplifying unit in a pixel. Specifically, for example, it has been found that, in the case where a reset transistor in a pixel is used to clip the voltage of the input node of an amplifying unit, the degree of crosstalk of signals which occurs between pixel lines is variable depending on the voltage supplied to the gate of the reset transistor upon clipping. In the case where the reset transistor is an N-transistor, the voltage supplied to the gate of the reset transistor is set to be high, enabling the crosstalk of signals which occurs between pixel lines to be reduced. However, when the voltage supplied to the gate of the reset transistor is simply set to be high for a clipping operation, the signal saturation in a pixel may be restricted. In other words, the dynamic range of a signal of a pixel may be narrowed. That is, in the case where only one value of the voltage supplied to the gate of the reset transistor for clipping is used, only one of the following choices is to be selected: a choice of making an image pickup apparatus operate so as to suppress the crosstalk of signals which occurs between pixel lines, and a choice of making an image pickup apparatus operate so as to maintain the dynamic range of a pixel.

SUMMARY OF THE INVENTION

The present invention provides an image pickup apparatus including multiple pixels. Each of the multiple pixels includes a photoelectric conversion element, an amplifying unit, a clipping transistor, and a clipping circuit. The amplifying unit amplifies a signal generated by the photoelectric conversion element. The source or the drain of the clipping transistor is electrically connected to an input node of the amplifying unit. The clipping circuit is capable of clipping a voltage of the input node of the amplifying unit. The clipping circuit is capable of switching between a first operation and a second operation. In the first operation, a first voltage is supplied to the gate of the clipping transistor in a time period in which the amplifying unit reads out an optical signal. In the second operation, a second voltage that is higher than the first voltage is supplied to the gate of the clipping transistor in the time period in which the amplifying unit reads out an optical signal.

Further features of the present invention will become apparent from the following description of exemplary embodiments with reference to the attached drawings.

DESCRIPTION OF THE EMBODIMENTS

Figure 1:
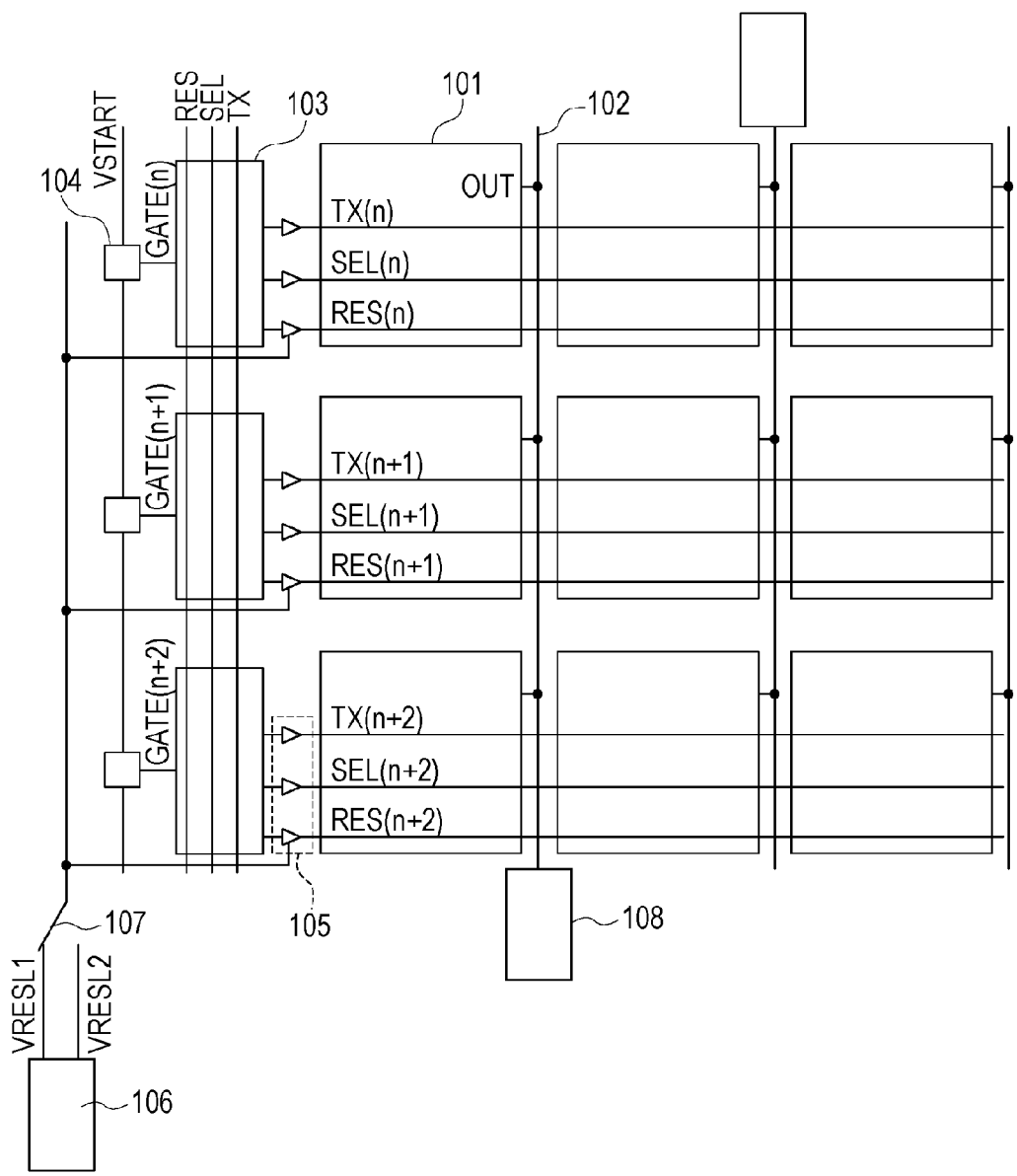
FIG. 1 is a block diagram illustrating the entirety of an image pickup apparatus according to a first embodiment.

An exemplary image pickup apparatus according to embodiments of the present invention includes a clipping circuit (first clipping circuit) which can clip the voltage of the input node of an amplifying unit in a pixel. The clipping circuit has a clipping transistor whose source or drain is electrically connected to the input node of the amplifying unit in a pixel, and can clip the voltage of the input node of the amplifying unit in the pixel. The clipping circuit may be constituted by a reset transistor which resets the voltage of the input node of the amplifying unit in a pixel, and a control circuit for the reset transistor. The control circuit may be constituted by a vertical scan circuit and a timing generation apparatus. The clipping circuit can operate at least in a time period in which an optical signal is read out from a pixel, and can switch among multiple clipping voltages. This configuration enables the image pickup apparatus to switch, for example, between a mode in which saturation extension for a pixel signal is prioritized and a mode in which the sensitivity of a pixel is prioritized. In other words, switching can be performed between a high gain mode and a low gain mode in which the gain is lower than that in the high gain mode.

The time period in which an optical signal from a pixel is read out may be the following time period. In the case where a pixel includes a transfer gate which transfers a charge from a photoelectric conversion element to the input node of the amplifying unit, the time period is one in which the transfer gate is conducting. Alternatively, the time period is one in which an optical signal is present at the input node of the amplifying unit in a pixel and in which the pixel is selectable. Both of the time periods or either of the time periods may be called an optical-signal readout time period for a pixel. The clipping circuit according to the embodiments of the present invention can operate at least in a part of the optical-signal readout time period for a pixel.

When a pixel is irradiated with intense light, the signal level of the pixel increases, causing the amplitude of the potential in a vertical signal line to increase. The potential in the vertical signal line markedly changes when an optical signal is read out, whereby crosstalk may occur in signals. For example, a case may occur in which a vertical signal line and a power supply line cause capacitive coupling which changes the voltages of the input nodes of the amplifying units in adjacent pixels.

To address this, if a clipping circuit is provided for the input node of the amplifying unit in a pixel so as to restrict the amplitude of an output signal, noise caused by the crosstalk can be reduced. However, if the clipping circuit is always ready to operate, the saturation level of a signal in a vertical signal line may be made low. In another case, a column circuit may include an amplifying circuit of high gain (e.g., ten times or more higher gain). In this case, the signal saturation in a circuit located downstream of the column circuit may serve as a bottleneck. Accordingly, the saturation level of a vertical signal line may be low. For example, when an n-times gain is obtained from a column amplifier, the amplitude of the potential of the vertical signal line may be as low as 1/n. Therefore, in the case where the gain of the amplifying circuit of the column circuit can be switched between a first gain and a second gain which is higher than the first gain, the clipping circuit may operate in the time period for the first gain. Further, the location where a clipping circuit is provided is not limited only to the amplifying node in a pixel. For example, a clipping circuit (second clipping circuit) may be provided for the output node of the amplifying unit in a pixel. Furthermore, a clipping circuit (third clipping circuit) may be provided for the output node of the column circuit. For example, in a first mode in which the column circuit operates at low gain, the clipping circuit at the input node of the amplifying unit in a pixel is made ready to operate. In a second mode in which the column circuit operates at high gain compared with that in the first mode, the second or third clipping circuit may be made ready to operate. This configuration can enhance controllability for clipping.

The noise caused by the crosstalk which occurs at a pixel unit is amplified when the gain of the amplifying unit located downstream of the pixel, such as a column circuit, is high. Therefore, when the gain of the column amplifier is high, this may result in a bigger problem.

Therefore, especially when an embodiment of the present invention is applied to such a configuration, a high effect may be achieved.

The embodiments will be specifically described below.

First Embodiment

FIG. 1 is a block diagram illustrating the entirety of an image pickup apparatus according to a first embodiment. Multiple pixels 101 are two-dimensionally arranged. In this example, nine pixels in total are arranged in three lines and three columns. However, more pixels may be arranged so as to form a pixel array.

Signals are output from the multiple pixels 101 to vertical signal lines 102. Signals are output from multiple pixels 101 to a corresponding one of the vertical signal lines 102 substantially at the same time. Specifically, signals from the pixels 101 included in the same pixel line may be output to a corresponding one of the vertical signal lines 102 substantially at the same time. Each of the vertical signal lines 102 may be provided for a corresponding one of the pixel columns. Each of the pixel columns may be provided with multiple vertical signal lines 102, or multiple pixel columns may share one vertical signal line 102. A clipping circuit (second clipping circuit) which clips the voltage of the vertical signal line 102 may be provided for the vertical signal line 102. In other words, the second clipping circuit is a clipping circuit provided for the output node of the amplifying unit in a pixel.

Multiple logic circuits 103 each may be provided for a corresponding one of the pixel lines. Each of the logic circuits 103 can receive a gate pulse GATE(n) from a unit shift register 104 and driving pulses from a reset pulse line RES, a selecting pulse line SEL, and a transfer pulse line TX, and perform a logic operation on them so as to supply the results as driving pulses.

The pulses which are output from the logic circuit 103 can be supplied to a reset transistor, a transfer gate, and a selection transistor in a pixel, which are described below, via respective buffer units 105. Each of the buffer units 105 has multiple buffer circuits, each of which is provided for a corresponding one of the reset transistors, the transfer gate, and the selection transistor. The buffer circuit may be at least a voltage buffer circuit, and, for example, an inverter may be used.

A mode switching unit 106 can supply two voltages VRESL1 and VRESL2 that are different to each other. A switch 107 switches between the voltages that are output from the mode switching unit 106, VRESL1 and VRESL2, so as to supply the voltage to each of the buffer units 105. The voltages VRESL1 and VRESL2 are supplied to a buffer circuit for supplying a driving pulse to the gate of the reset transistor, among the buffer circuits included in each of the buffer units 105.

Voltages may be supplied to the buffer circuits for the transfer gate and the selection transistor, but this is not illustrated in FIG. 1. Further, voltages which are used to cause the reset transistor, the transfer gate, and the selection transistor to conduct may be supplied to the buffer circuits in each of the buffer units 105, but this is not illustrated in FIG. 1. In addition, the switch 107 may be provided in the mode switching unit 106.

Column circuits 108 each are provided for a corresponding one of the vertical signal lines 102. For example, each of the column circuits 108 includes a noise reduction circuit, an amplifying circuit, and an analog-digital conversion circuit. The column circuit 108 may include all of these, or may include either one or some of these circuits. Further, other circuits may be included. In addition, a clipping circuit (third clipping circuit) which clips the voltage of the output node of the amplifying circuit in the column circuit may be provided for the column circuit.

Figure 2:
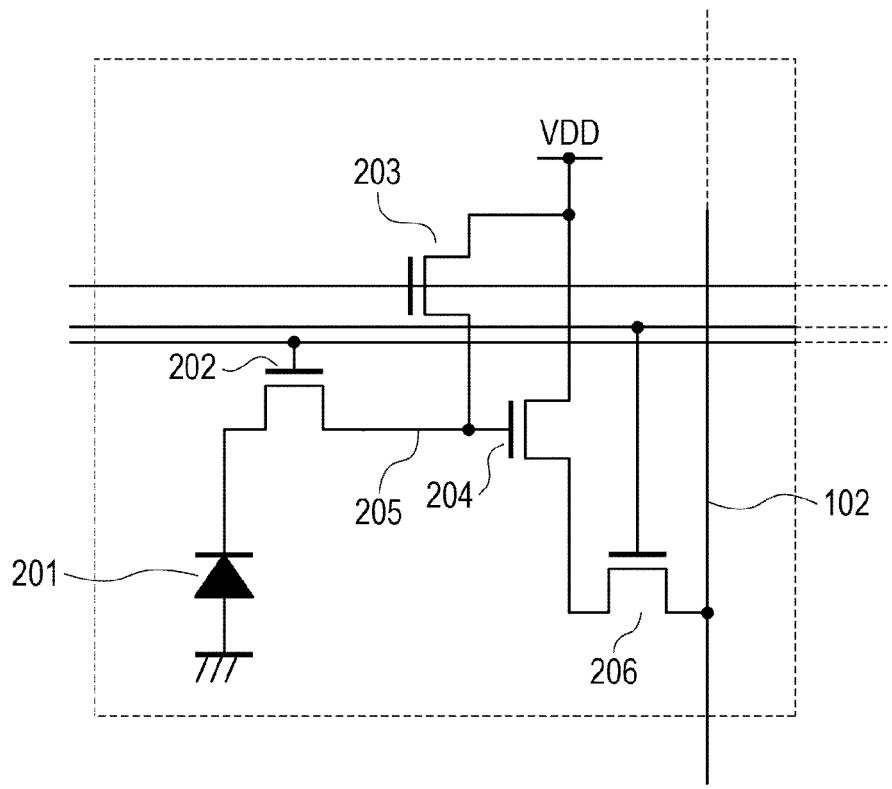
FIG. 2 is an equivalent circuit diagram for an exemplary pixel in an image pickup apparatus according to an embodiment of the present invention.

FIG. 2 is an equivalent circuit diagram for an exemplary pixel 101. An example will be described in which electrons are used as a signal charge, and in which an N-transistor is used as a transistor for a pixel. Alternatively, holes may serve as a signal charge, or a P-transistor may be used as a transistor for a pixel.

A photodiode 201 converts incident light into electron-hole pairs. The photodiode 201 may be replaced with other known photoelectric conversion elements. An embedded photodiode is most preferably used as a photoelectric conversion element. A transfer gate 202 transfers electrons produced by the photodiode 201 to a floating diffusion 205. The floating diffusion 205 may be constituted by an N-semiconductor region. A reset transistor 203 supplies a predetermined voltage to the floating diffusion 205. A power supply voltage VDD may be supplied to the drain of the reset transistor 203. The power supply voltage VDD is, for example, 5 V or 3.3 V. An amplifier transistor 204 amplifies a signal based on the electrons produced by the photodiode 201, and the gate of the amplifier transistor 204 is electrically connected to the floating diffusion 205. Similarly to the reset transistor 203, the power supply voltage VDD may be supplied to the drain of the amplifier transistor 204. A selection transistor 206 may be provided in an electric path between the source of the amplifier transistor 204 and the vertical signal line 102.

The transfer gate 202 is supplied with a transfer control pulse via a transfer gate control line TX(n). The gate of the reset transistor 203 is supplied with a reset control pulse via a reset gate control line RES(n). The gate of the selection transistor 206 is supplied with a selection control pulse via a selection gate control line SEL(n). The symbol 'n' in the parentheses indicates that the control line corresponds to the nth pixel line.

A signal generated by the photodiode 201 is transferred to the floating diffusion 205, and is amplified by the amplifier transistor 204 so as to be output to the vertical signal line 102 via the selection transistor 206. A source follower may be used as the amplifier transistor 204. In addition, the selection transistor 206 may be provided on the drain side of the amplifier transistor 204. Alternatively, instead of a dedicated transistor for a selection operation, the voltage supplied to the floating diffusion 205 from the reset transistor 203 may be used to switch between a state in which the pixel is selected, and a state in which the pixel is not selected. In addition, multiple photodiodes 201 may share some transistors in a pixel, such as the reset transistor 203 and the amplifier transistor 204.

The input node of the amplifier transistor 204 serving as an amplifying unit in a pixel is constituted by the gate and a node which is electrically connected to the gate. Therefore, the reset transistor 203 may operate as a part of a clipping circuit which clips the voltage of the input node of the amplifying unit in a pixel. Specifically, a time period in which the reset transistor 203 can perform a clipping operation is constituted by, for example, a conducting time period in which the transfer gate 202 is conducting, and time periods before and after the conducting time period. After many electrons are transferred to the floating diffusion 205 by the transfer gate 202, when the voltage of the floating diffusion 205 which is the input node of the amplifying unit in a pixel significantly decreases, the reset transistor 203 can operate.

Figure 3:
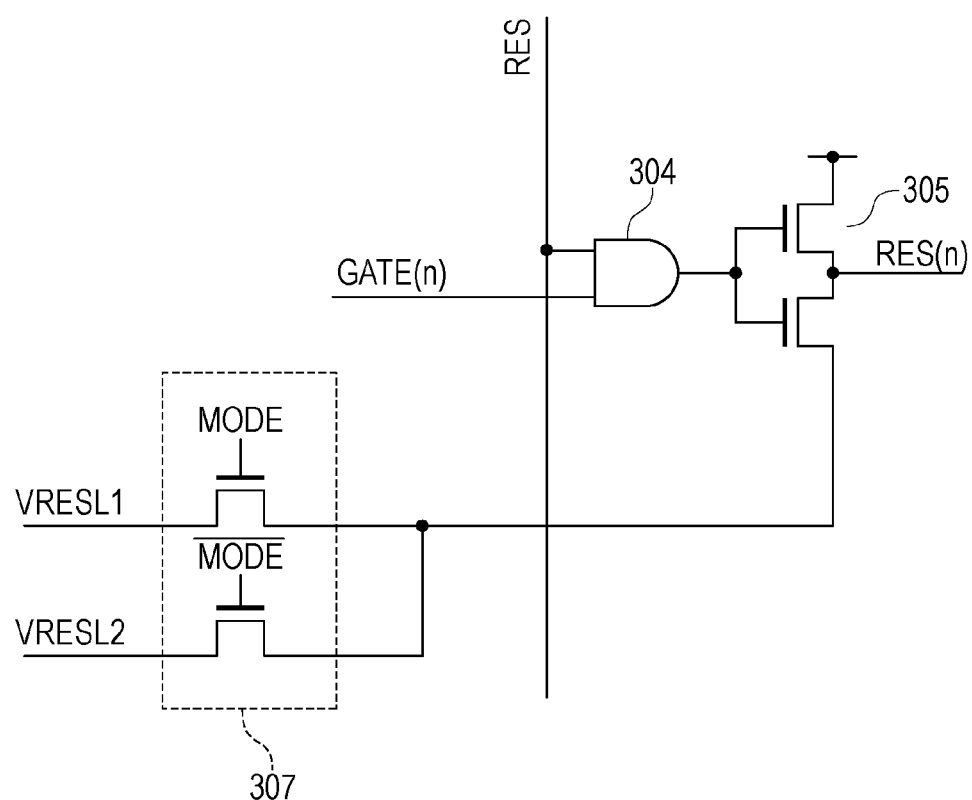
FIG. 3 is a schematic diagram illustrating a portion for supplying a voltage to the gate of a reset transistor according to the first embodiment.

FIG. 3 illustrates the configuration of a portion for supplying a driving pulse to the gate of the reset transistor 203. An AND circuit 304 may correspond to the logic circuit 103. An inverter 305 may correspond to the buffer unit 105. It is assumed that a relation, the voltage VRESL1<the voltage VRESL2, is satisfied. A switch 307 corresponds to the switch 107. The switch 307 includes two transistors. Each of the gates of the transistors is supplied with one of complementary driving pulses, and the transistors can be controlled in such a manner that, when one transistor conducts, the other does not. The switch 307 can switch the voltage supplied to the source of an N-transistor in the inverter 305, between the voltages VRESL1 and VRESL2. The AND circuit 304 performs a logical operation on a signal supplied through the pulse line RES and a signal supplied from the pulse line GATE(n), and supplies the result to the gate of the inverter 305. When the output from the AND circuit 304 is at a high level, the N-transistor of the inverter 305 conducts, and the voltage supplied to the source of the N-transistor serves as the output from the inverter 305. When the output from the AND circuit 304 is at a low level, the P-transistor of the inverter 305 conducts, and the voltage supplied to the source of the P-transistor serves as the output from the inverter 305. The output node of the inverter 305 is connected to the reset gate control line RES(n). The reset transistor 203 is an N-transistor. Accordingly, when the output from the inverter 305 is at a high level, the reset transistor 203 conducts. When the output from the inverter 305 is at a low level, the reset transistor 203 does not conduct. According to the configuration of the first embodiment, when the reset transistor 203 is in a non-conductive state, the voltage supplied to the gate of the reset transistor 203 can be switched.

Figure 4A:
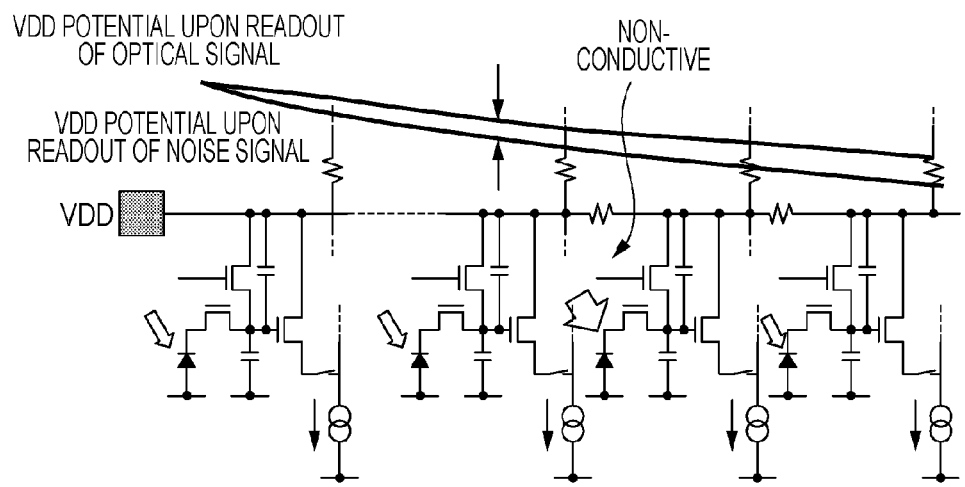
FIGS. 4A and 4B are diagrams for describing a mechanism of suppressing crosstalk of signals which occurs between lines according to an embodiment of the present invention.
Figure 4B:
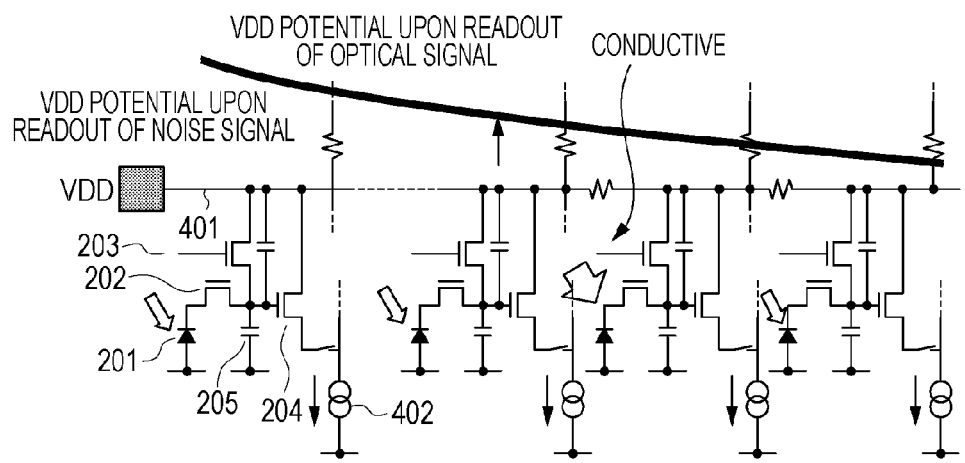

The clipping operation will be described with reference to FIGS. 4A and 4B. FIG. 4A illustrates a state in which a clipping operation is not performed, and FIG. 4B illustrates a state in which a clipping operation is performed. A power supply line 401 is a line for supplying a voltage to the drain of the reset transistor 203 and to that of the amplifier transistor 204 in a pixel. A line for the reset transistor 203 and a line for the amplifier transistor 204 may be separately provided. A current source 402 can supply a bias current to the amplifier transistor 204 so as to cause the amplifier transistor 204 to perform an amplifying operation. The amplifier transistor 204 can perform a source follower operation. The current source 402 may be constituted by an active load including a transistor. The current source may be a cascade connection current source by disposing a transistor which performs a common-source amplifying operation or a grounded-gate amplifier transistor in an electric path between a common-source amplifying transistor and the vertical signal line.

The floating diffusion 205 may form capacitive coupling with the power supply line 401 for supplying the power supply voltage VDD to a pixel.

It is assumed that a certain photodiode is irradiated with light stronger than that for surrounding photodiodes. In FIGS. 4A and 4B, the third photodiode 201 from the left is irradiated with intense light compared with surrounding photodiodes 201. The photodiode 201 irradiated with intense light produces many electron-hole pairs, and a large amount of electrons are transferred via the transfer gate 202. Therefore, the reduction amount for the voltage of the floating diffusion 205 is relatively large compared with other pixels in the same pixel line. As described above, the floating diffusion 205 and the power supply line 401 may form capacitive coupling. Therefore, as the voltage of the floating diffusion 205 changes, the voltage of the power supply line 401 may be influenced. Then, the voltage of the power supply line 401 returns back to the original voltage after a certain time period, depending on a time constant determined by a resistance of the power supply line 401. That is, depending on the intensity of the incident light, the degree of a change in the voltage of the power supply line 401 may be different. This may influence signals in surrounding pixels.

Here, the case will be especially described in which a so-called correlated double sampling (CDS) operation for removing noise of a transistor in a pixel is performed. A signal obtained after the floating diffusion 205 is reset is a noise signal, and a signal obtained after electrons from the photodiode 201 are transferred is an optical signal. Change in the voltage of the power supply line 401 may result in a state in which the voltage supplied to the drain of the amplifier transistor 204 when a noise signal is read out may be different from that supplied to the drain of the amplifier transistor 204 when an optical signal is read out. FIG. 4A illustrates the difference in the voltage of the power supply line 401. In this case, even when the noise is reduced in a circuit located downstream of a pixel, it is difficult to remove the influence of the change in the power supply voltage completely. This may appear as noise between pixel lines. Therefore, especially in the case where a CDS operation is performed, the influence may appear as noise.

Such noise is significantly large when the reduction amount of the voltage of the floating diffusion 205 is large. To address this, the voltage supplied to the gate of the reset transistor 203 is set to be high during a time period in which the reset transistor 203 is not conducting, enabling the above-described noise to be reduced. FIG. 4B illustrates such a state. The time period in which the reset transistor 203 is not conducting is a time period in which electrons from the photodiode 201 are being transferred to the floating diffusion 205 by the transfer gate 202. A specific pulse diagram will be described below.

The clipping operation performed by the reset transistor 203 will be described in more detail.

For example, it is assumed that a voltage of 1.5 V which is a voltage for the non-conductive state is supplied to the gate of the reset transistor 203, and that the threshold voltage of the reset transistor 203 is 0.7 V.

When the transfer gate 202 transfers a small amount of electrons, the reset transistor 203 remains in the non-conductive state. Accordingly, a signal corresponding to the amount of the transferred electrons may be output to the vertical signal line 102 via the amplifier transistor 204.

In contrast, it is assumed that the transfer gate 202 transfers a large amount of electrons to the floating diffusion 205, and that the voltage of the floating diffusion 205 decreases below 0.8 V. The floating diffusion 205 is electrically connected to the source of the reset transistor 203. Thus, likewise, the voltage of the source of the reset transistor 203 also decreases, and the gate-source voltage of the reset transistor 203 exceeds the threshold, causing the reset transistor 203 to conduct. This prevents the voltage of the floating diffusion 205 from decreasing below this level. Such an operation is called a clipping operation. Therefore, the voltage of the floating diffusion 205 does not decrease below a predetermined value, resulting in a small change in the voltage of the power supply line 401 which occurs via the parasitic capacitance. Thus, the difference between the drain voltage of the amplifier transistor 204 upon readout of a noise signal and the drain voltage of the amplifier transistor 204 upon readout of an optical signal is small, enabling the noise to be reduced.

However, a high voltage supplied to the gate of the reset transistor 203 which does not conduct may decrease the saturation value of a signal in the floating diffusion 205. This is because, when the photodiode 201 produces many electrons which are transferred to the floating diffusion 205, the reset transistor 203 may restrict the voltage change based on the amount of the electrons.

To address this, the image pickup apparatus according to the first embodiment has a configuration in which, when the reset transistor 203 does not conduct, voltages having different values can be supplied to the gate of the reset transistor 203. Switching can be performed among these voltages in accordance with a mode of the image pickup apparatus. For example, description will be made for the case in which the image pickup apparatus is provided with two modes which are the high saturation mode and the high sensitivity mode in which the saturation is smaller than that in the high saturation mode. To implement these modes, an amplifying circuit having a gain switching function is provided for a circuit located downstream of a pixel. The amplification is performed with a first gain in the high saturation mode, and with a second gain, which is larger than the first gain, in the high sensitivity mode. The first mode may be called a low gain mode, and the second mode may be called a high gain mode.

In the high saturation mode, the voltage supplied to the gate of the reset transistor 203 which does not conduct is set to VRESL1, whereas, in the high sensitivity mode, to VRESL2 (VRESL1<VRESL2). For example, while the voltage VRESL1 is being supplied, when a charge corresponding to the saturation charge of the photoelectric conversion element is transferred to the input node of the amplifying unit, a clipping operation is not performed. In contrast, while the voltage VRESL2 is being supplied, when a charge equivalent to the saturation charge of the photoelectric conversion element is transferred to the input node of the amplifying unit, a clipping operation is performed. The equivalence to the saturation charge will be described. The saturation charge indicates the maximum amount of charge which can be accumulated by the photoelectric conversion element. This may be determined by, for example, an impurity ion concentration and the volume of a semiconductor region in which a signal charge is accumulated in the photodiode 201. When the saturation charge is exceeded, a charge may leak into surrounding pixels. The equivalence to the saturation charge means a charge amount in a range from −5% to +5% of the saturation charge.

This configuration enables the saturation to be set to be high in the high saturation mode, and enables noise to be reduced in the high sensitivity mode, resulting in improvement of the signal-to-noise ratio (SN ratio) in the high sensitivity mode.

A preferable condition for the voltages VRESL1 and VRESL2 will be described. The voltage VRESL1 is not particularly limited as long as it is smaller than the voltage VRESL2. The voltage VRESL1 may be 0 V or a negative voltage. The voltage VRESL1 may be one which causes a clipping operation not to be performed even when the reduction amount of the voltage of the floating diffusion 205 is large. Alternatively, the voltage VRESL1 may be one which causes a clipping operation to be performed, but which causes a clipping operation not to be performed when the voltage of the floating diffusion 205 does not further decrease compared with the voltage VRESL2. In this configuration, it is preferable to employ a configuration in which the second or third clipping circuit may operate.

For example, it is assumed that the amplifier transistor 204 performs a source follower operation, and that a load transistor which serves as an active load constituting a current source is provided on the source side of the amplifier transistor 204. Further, the threshold of the reset transistor 203 is Vth(res), and the threshold of the amplifier transistor 204 is Vth(sf). The drain voltage which is used in order that the load transistor (not illustrated) which serves as an active load operates in a saturation region is represented by VDSAT. The voltage of the floating diffusion 205 is represented by VFD, and the source voltage of the amplifier transistor 204 is represented by VSF.

The following expressions hold in a state where the reset transistor 203 is performing a clipping operation.

$$VFD = VRESL2 - Vth(res) \quad \text{Expression 1}$$

$$VSF = VFD - Vth(sf) \quad \text{Expression 2}$$

The following expression is to hold in order that the load transistor operates in the saturation region.

$$VSF > VDSAT \quad \text{Expression 3}$$

Therefore, the following expression holds.

$$VRESL2 > VDSAT + Vth(res) + Vth(sf) \quad \text{Expression 4}$$

The description of this expression which is made in a sentence is that it is desirable that the voltage VRESL2 be at least more than the sum of an overdrive voltage of the load transistor, the threshold voltage of the reset transistor 203, and the threshold voltage of the amplifier transistor 204.

Figure 5:
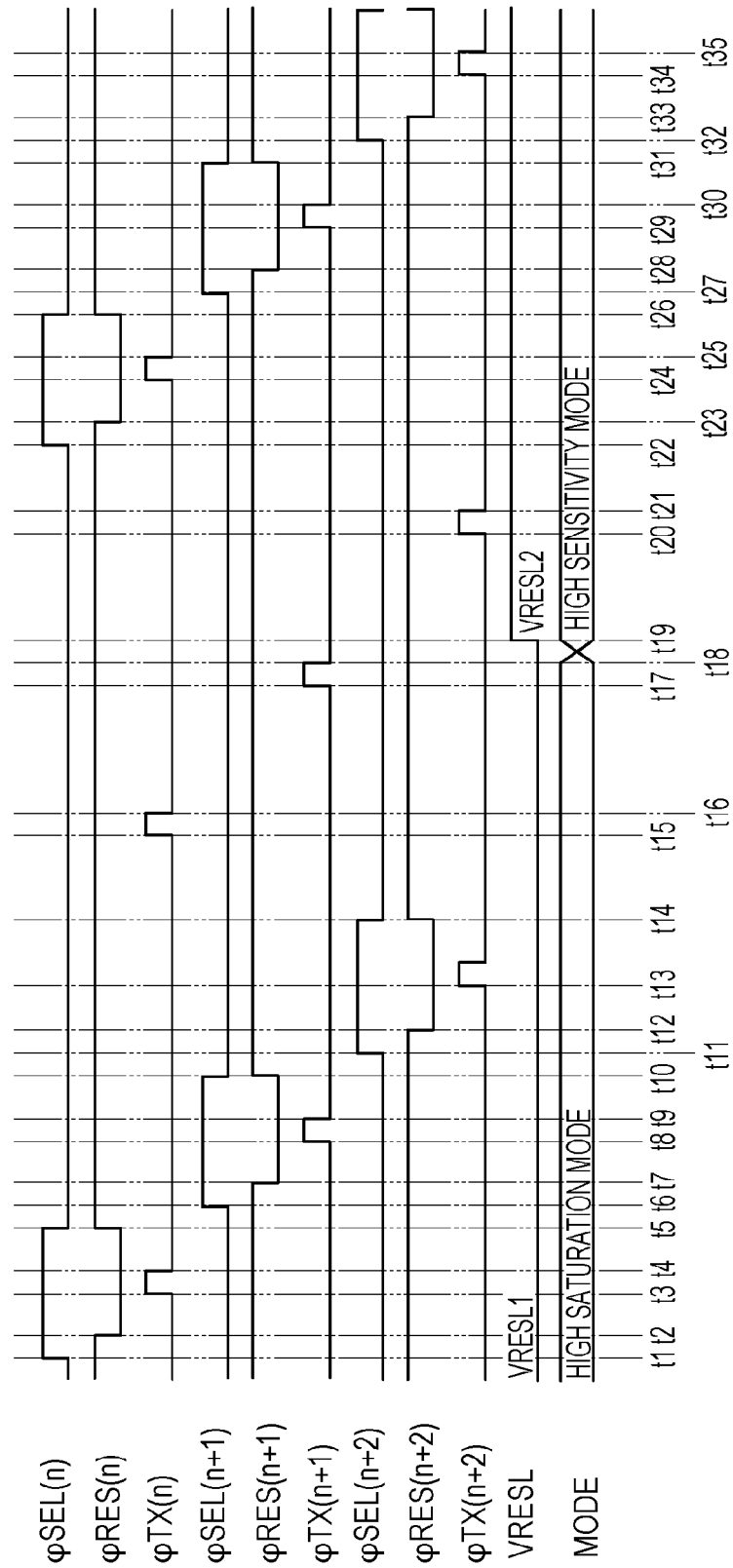
FIG. 5 is a diagram illustrating driving pulses in the image pickup apparatus according to the first embodiment.

FIG. 5 is a diagram illustrating exemplary driving pulses in the image pickup apparatus according to the first embodiment. A pulse φSEL is a driving pulse supplied to the gate of the selection transistor 206; a pulse φRES is a driving pulse supplied to the gate of the reset transistor 203; and a pulse φTX is a driving pulse supplied to the transfer gate 202. All of the pulses at high level cause the transistors to conduct. In addition, the suffix indicates the pixel line number.

First, the image pickup apparatus is set to the high saturation mode. A transfer gate 202 is supplied with a pulse at a high level, and the voltage level supplied to the gate of a reset transistor 203 is VRESL1 during a time period in which electrons from a photodiode 201 are transferred.

At and before time t1, the pulse φRES in each of the lines is set to a high level, and reset transistors 203 turn to a conductive state. Therefore, the reset voltages are supplied to floating diffusions 205.

At time t1, the pulse φSEL in the nth line is set to a high level, and the selection transistors 206 in the nth line turn to the conductive state. The amplifier transistors 204 in the pixels in the nth line perform a source follower operation, whereby the voltage of each of the vertical signal lines 102 depends on the voltage of the gate of a corresponding one of the amplifier transistors 204.

At time t2, the pulse φRES in the nth line is shifted from the high level to a low level, and the reset transistors 203 in the nth line turn to the non-conductive state. In this stage, noise signals in the pixels in the nth line are stored, for example, in the column circuits 108.

At time t3, the pulse φTX in the nth line is shifted from a low level to a high level, and electrons from the photodiodes 201 are transferred to the floating diffusions 205. At time t4, the pulse φTX in the nth line is shifted from the high level to the low level, and the transfer of electrons from the photodiodes 201 to the floating diffusions 205 is completed.

At least in the time period from t3 to t4, the voltage VRESL1 is supplied to the gates of the reset transistors 203.

At time t5, the pulse φSEL in the nth line is shifted from the high level to a low level, and the pulse φRES in the nth line is shifted from the low level to the high level.

In the time period from t4 to t5, optical signals in the pixels in the nth line are stored, for example, in the column circuits 108.

At this time point, the readout operation for the pixels in the nth line is completed. After that, an operation (not illustrated in FIG. 5) in which the signals stored in the column circuits 108 are read out by using a known horizontal scanning circuit or the like is performed.

Similar operations are performed for the (n+1)th line in the time period from t6 to t10, and similar operations are performed for the (n+2)th line in the time period from t11 to t14.

In the time period from t15 to t16, while the pulse φRES in the nth line remains at the high level, the transfer gates 202 in the nth line are supplied with the voltage at the high level. This causes the photodiodes 201 in the pixels in the nth line to be reset. The time t16 is a start time for accumulation in the photodiodes 201 in the pixels in the nth line.

In the time period from t17 to t18, while the pulse φRES in the (n+1)th line remains at the high level, the transfer gates 202 in the (n+1)th line are supplied with the voltage at a high level. This causes the photodiodes 201 in the pixels in the (n+1)th line to be reset. The time t18 is a start time for accumulation in the photodiodes 201 in the pixels in the (n+1)th line.

At time t19, the voltage supplied to the gates of the reset transistors 203 which do not conduct is switched from VRESL1 to VRESL2 (VRESL1<VRESL2). That is, at least at time t19, the mode of the image pickup apparatus is switched from the high saturation mode to the high sensitivity mode.

The timing at which the mode of the image pickup apparatus is switched is not limited to this. The mode may be switched until the timing at which transfer gates 202 actually transfers electrons in the photodiodes 201 to the floating diffusions 205. When the mode of the image pickup apparatus is switched, an influence may be exerted on signals, for example, via the parasitic capacitance. Accordingly, it is desirable to switch the mode of the image pickup apparatus in the time period in which signals are not being read out.

In the time period from t20 to t21, while the pulse φRES in the (n+2)th line remains at the high level, the transfer gates 202 in the (n+2)th line are supplied with the voltage at the high level. This causes the photodiodes 201 in the pixels in the (n+2)th line to be reset. The time t21 is a start time for accumulation in the photodiodes 201 in the pixels in the (n+2)th line.

After that, operations similar to those in the high saturation mode are performed after time t22.

According to the first embodiment, a configuration is employed in which multiple supply voltages are supplied to the gate of a reset transistor which does not conduct. This configuration enables the clipping voltage of a clipping circuit to be switched in the time period in which an optical signal is read out from a pixel. This configuration enables the mode of the image pickup apparatus to be selected from a mode in which reduction in crosstalk between pixel lines is prioritized, and a mode in which saturation extension for a pixel signal is prioritized.

Second Embodiment

Figure 6:
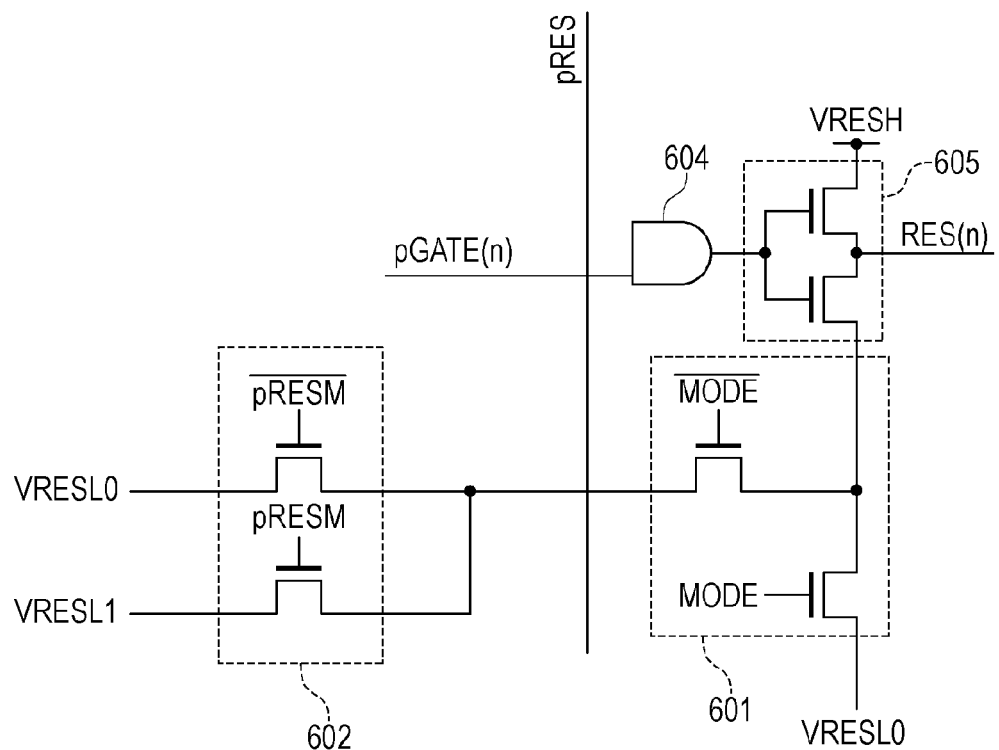
FIG. 6 is a schematic diagram illustrating a portion for supplying a voltage to the gate of a reset transistor according to a second embodiment.

FIG. 6 illustrates the configuration of a portion for supplying a voltage to the gate of a reset transistor 203 which does not conduct, according to a second embodiment. The components which are not illustrated in FIG. 6 may be similar to those in the configuration according to the first embodiment.

A first switch 601 is controlled in accordance with the switching of the mode of the image pickup apparatus, and is constituted by two transistors.

A second switch 602 is controlled by a pulse pRESM which is different from the pulse for switching the mode of the image pickup apparatus. The pulse pRESM is set to a high level in such a manner as to be synchronized with the transfer gate 202 which is at a high level, or is set to the high level at a predetermined time earlier than the time point at which the transfer gate 202 is shifted from a low level to the high level. The pulse pRESM is shifted to a low level when a predetermined time period has elapsed after the transfer gate 202 is shifted from the high level to the low level. The second switch 602 is also constituted by two transistors.

An AND circuit 604 and an inverter 605 are similar to the AND circuit 304 and the inverter 305, respectively, according to the first embodiment, and will not be described in detail.

In the first mode, one transistor in the first switch 601 conducts, whereas the other transistor does not. This causes the source of the N-transistor in the inverter 605 to be supplied with a voltage VRESL0. That is, in the first mode, the voltage supplied to the gate of the reset transistor 203 which does not conduct is only the voltage VRESL0.

In the second mode, a transistor which is included in the first switch 601 and which does not conduct in the first mode turns to the conductive state. Depending on the conductive condition of the transistors in the second switch 602, the voltage supplied to the source of the N-transistor in the inverter 605 can be switched between the voltages VRESL0 and VRESL1 (VRESL0<VRESL1). That is, in a single mode of the second mode, the voltage which can be supplied to the gate of the reset transistor 203 which does not conduct can be switched between the voltages VRESL0 and VRESL1.

In addition to the effect obtained by the first embodiment, this configuration enables the gate voltage of the reset transistor 203 to be switched at any time even in the time period in which the reset transistor 203 is not conducting. This configuration enables the clipping voltage to be switched at any timing in the time period in which an optical signal is read out from a pixel.

Third Embodiment

Figure 7:
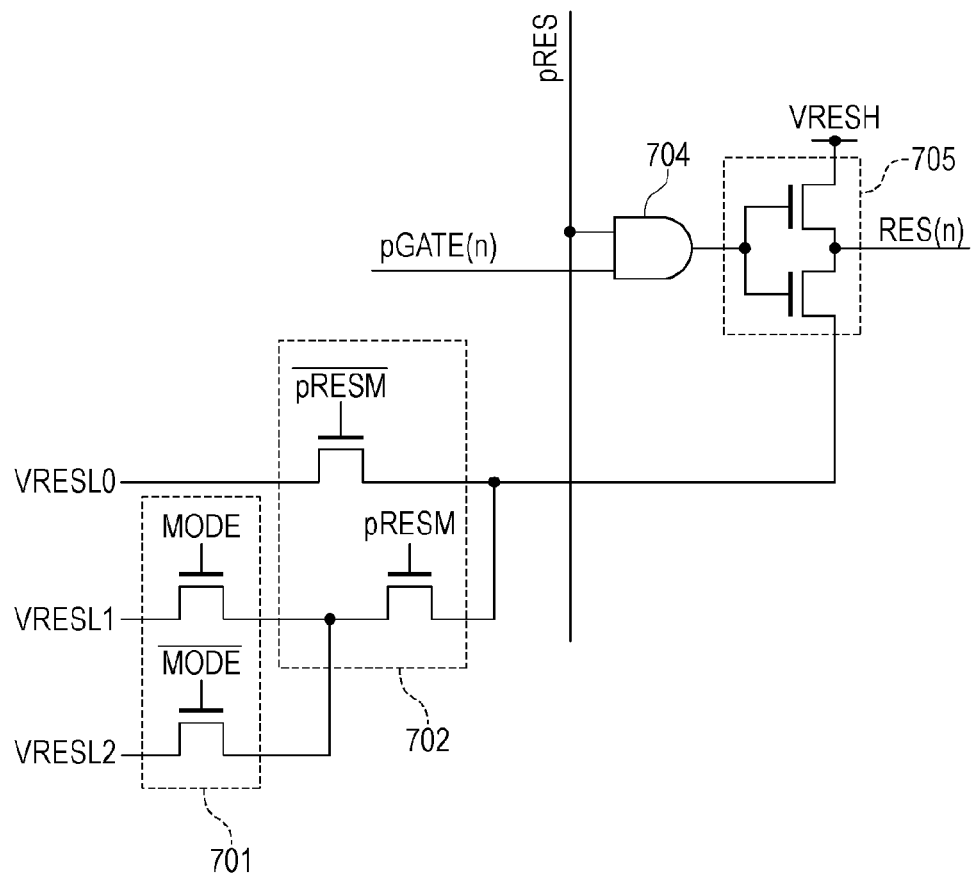
FIG. 7 is a schematic diagram illustrating a portion for supplying a voltage to the gate of a reset transistor according to a third embodiment.

FIG. 7 illustrates the configuration of a portion for supplying a voltage to the gate of a reset transistor 203 which does not conduct, according to a third embodiment. The components which are not illustrated in FIG. 7 may be similar to those according to the first embodiment.

An AND circuit 704 and an inverter 705 are similar to the AND circuit 604 and the inverter 605, respectively, according to the second embodiment, and will not be described in detail.

A first switch 701 is controlled in accordance with the switching of the mode of the image pickup apparatus, and is constituted by two transistors. Through the first switch 701, the voltage supplied to the source of the N-transistor in the inverter 705 can be switched between the voltages VRESL1 and VRESL2 (VRESL1<VRESL2).

A second switch 702 is controlled by a pulse pRESM which is different from the pulse for switching the mode of the image pickup apparatus, and is constituted by two transistors. The pulse pRESM is set to a high level in such a manner as to be synchronized with the transfer gate 202 which is at a high level, or is set to the high level at a predetermined time earlier than the time point at which the transfer gate 202 is shifted from a low level to the high level. The pulse pRESM is shifted to a low level when a predetermined time period has elapsed after the transfer gate 202 is shifted from the high level to the low level.

According to the third embodiment, in addition to the effects of the first and second embodiments, the voltage supplied to the gate of the reset transistor 203 which does not conduct can be switched among three values. For example, the voltage VRESL0 causes the reset transistor 203 not to perform a clipping operation even when a charge equivalent to the saturation charge of a photodiode 201 is transferred to the floating diffusion 205. The voltages VRESL1 and VRESL2 may cause the reset transistor 203 to perform a clipping operation. Compared with the voltage VRESL1, the voltage VRESL2 is likely to perform a clipping operation even when a change in the voltage of the floating diffusion 205 is small. That is, the voltage which may cause a clipping operation to be performed can be switched. This configuration enables a range of choices for the clipping voltage of the clipping circuit to be further widened.

Fourth Embodiment

Figure 8A:
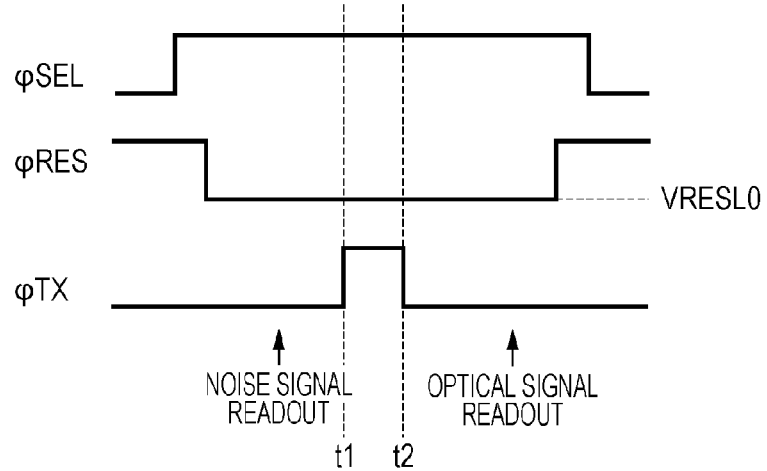
FIGS. 8A to 8C are diagrams illustrating driving pulses in an image pickup apparatus according to a fourth embodiment.
Figure 8B:
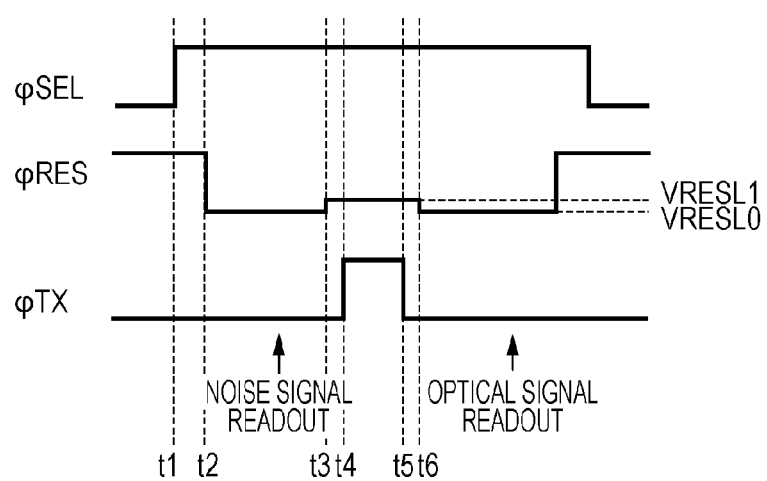
Figure 8C:
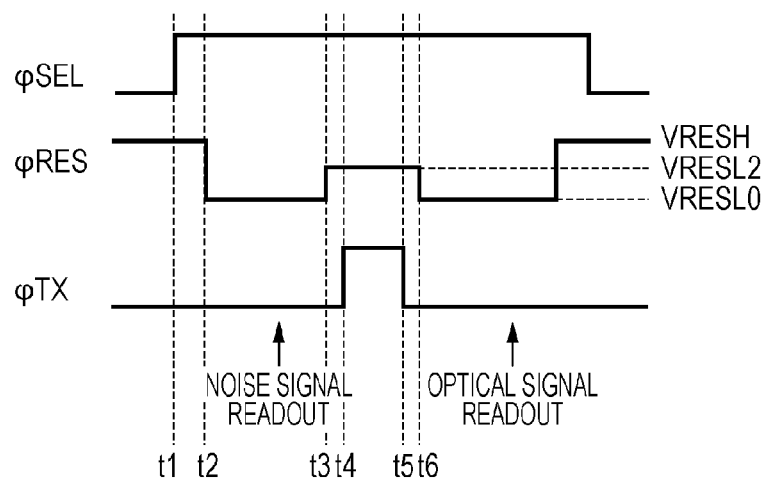

FIGS. 8A to 8C are diagrams illustrating driving pulses according to a fourth embodiment. The difference between the first and fourth embodiments is the waveform of a pulse supplied to the gate of the reset transistor 203 which does not conduct. That is, the clipping operations performed by the clipping circuit are different from each other. As the rest of the configuration, the configuration according to the first embodiment may be used. The components which are similar to those according to the above-described embodiments are designated with identical reference numerals, and will not be described in detail.

According to the first embodiment, in the first mode (high saturation mode), the gate level of the reset transistor 203 is the voltage VRESL1 when a noise signal or an optical signal is read out, and the gate level of the reset transistor 203 is also the voltage VRESL1 when the transfer gate 202 conducts. Here, the readout of an optical signal or a noise signal means that, for example, the column circuit 108 which is located downstream of a pixel stores the optical signal or the noise signal. In contrast, in the second mode (high sensitivity mode), the gate level of the reset transistor 203 is the voltage VRESL2 when a noise signal or an optical signal is read out, and the gate level of the reset transistor 203 is also the voltage VRESL2 when the transfer gate 202 conducts.

In the fourth embodiment, the gate level of the reset transistor 203 is set to VRESL1 at least in the time period in which the transfer gate 202 conducts.

According to the fourth embodiment, the voltage of the floating diffusion 205 upon the readout of a noise signal is set to VRESL0 regardless of the mode when the reset transistor 203 does not conduct. A change in the voltage of the floating diffusion 205 which is caused by the capacitive coupling can be constant regardless of the mode. Through this operation, a deviation between operating points of the amplifier transistor 204 in a pixel which occur when a noise signal is read out and when an optical signal is read out can be reduced.

Therefore, by performing the above-described operation, while a change in the operating point of the amplifier transistor 204 which occurs depending on the mode when a readout operation is performed is suppressed, only a clipping voltage can be adjusted in the floating diffusion 205. A specific description will be made with reference to FIGS. 8A to 8C.

In FIG. 8A, the pulse φRES has a low level which is a constant value, VRESL0, in a non-conductive state. Such an operation can be achieved in the configuration, for example, in FIG. 3, 6, or 7.

In the time period from t1 to t2, the pulse φTX is set to a high level, and electrons from the photodiode 201 are transferred by the transfer gate 202. The pulse φRES is constant at VRESL0 in the time period in which the reset transistor 203 does not conduct, including the time period from t1 to t2. Even when a charge, the amount of which is equivalent to the saturation charge amount of the photodiode 201, is transferred, the voltage VRESL0 is set to a voltage which causes a clipping operation not to be performed.

The pulse diagram in FIG. 8B will be described.

At time t1, the selection transistor 206 turns to the conductive state (first step).

At time t2, the first voltage VRESL0 is supplied to the reset transistor 203 (second step).

At time t3, the second voltage VRESL1 is supplied to the reset transistor 203 (third step).

At time t4, in the state in which the reset transistor 203 is supplied with the second voltage VRESL1, the transfer gate 202 turns to the conductive state (fourth step).

At time t5, the transfer gate 202 turns to the non-conductive state (fifth step).

At time t6, the gate of the reset transistor 203 is again supplied with the first voltage VRESL0. These pulses can be achieved in the configuration as in FIG. 6 or 7.

The operations in FIG. 8C are similar to those in FIG. 8B. However, at time t3, the φRES level is shifted from VRESL0 to VRESL2 (VRESL0<VRESL1<VRESL2). After the pulse φTX turns to the conductive state in the time period from t4 to t5, the φRES level is again shifted from VRESL2 to VRESL0 at time t6. These pulses can be achieved in the configuration as in FIG. 7. By switching between the operations in FIGS. 8B and 8C, the voltage change of the floating diffusion 205 which enables a clipping operation to be performed can be switched. Further, if a configuration is employed in which an operation can be performed also with the pulses in FIG. 8A, switching may be also performed between the case in which a clipping operation is performed and the case in which a clipping operation is not performed.

Multiple gate voltages for the reset transistor 203 which does not conduct enable the image pickup apparatus to switch among three or more modes as illustrated in FIGS. 8A to 8C.

As described above, the specific embodiments of the present invention are described. However, the present invention is not limited to these as long as the gist of the invention is preserved. The voltage is described by using the voltages VRESL0, VRESL1, and VRESL2. This specifies only a magnitude relation in the embodiments, and it is not indicated that the same voltage is used in the embodiments which are different from each other.

A reset transistor is taken as an example of a clipping circuit for the input node of the amplifying unit in a pixel. However, the clipping circuit is not limited to this. In addition to a reset transistor, the input node of the amplifying unit may have a transistor whose source or drain is electrically connected thereto.

For example, a configuration having a transfer gate is taken as an example of the configuration of a pixel. An embodiment of the present invention can be applied to a configuration in which a photodiode is directly connected to the gate of an amplifier transistor. In this case, a clipping operation may be performed in a time period in which the photodiode is irradiated with light and in which a charge is accumulated. Further, a clipping operation may be performed also in a time period in which a selection transistor conducts.

In addition to a configuration in which clipping is performed in a floating diffusion which is an input node of the amplifying unit in a pixel, a clipping circuit may be provided in a vertical signal line. The clipping circuit provided in a vertical signal line may perform a clipping operation not only in a time period in which an optical signal is read out from the amplifying unit in a pixel but also in a time period in which a noise signal is read out. This achieves an effect of suppressing a change in noise signal level which is caused by irradiating a photodiode with intense light and causing a charge to leak into a floating diffusion.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-008201 filed Jan. 18, 2012, which is hereby incorporated by reference herein in its entirety.

What is claimed is:

1. An image pickup apparatus comprising:
   a plurality of pixels, each of the plurality of pixels including a photoelectric conversion element and an amplifying unit configured to amplify a signal generated by the photoelectric conversion element; and
   a clipping circuit configured to be capable of clipping a voltage of an input node of the amplifying unit, the clipping circuit including a clipping transistor whose source or drain is electrically connected to the input node of the amplifying unit,
   wherein the clipping circuit is capable of switching between a first operation and a second operation, the first operation being configured to supply a first voltage to a gate of the clipping transistor in a time period in which an optical signal in the pixel is read out, the second operation being configured to supply a second voltage that is higher than the first voltage to the gate of the clipping transistor in the time period in which an optical signal in the pixel is read out.

2. The image pickup apparatus according to claim 1,
   wherein, in the first operation, a clipping operation is not performed when a charge equivalent to a saturation charge of the photoelectric conversion element is transferred to the input node of the amplifying unit, and
   wherein, in the second operation, a clipping operation is performed when a charge equivalent to the saturation charge of the photoelectric conversion element is transferred to the input node of the amplifying unit.

3. The image pickup apparatus according to claim 1,
   wherein the clipping circuit is capable of switching to a third operation in which a third voltage that is higher than the second voltage is supplied to the gate of the clipping transistor in the time period in which the amplifying unit reads out an optical signal.

4. The image pickup apparatus according to claim 1,
   wherein the pixel further includes a transfer gate configured to transfer a charge in the photoelectric conversion element to the input node of the amplifying unit.

5. The image pickup apparatus according to claim 4,
   wherein the time period in which an optical signal in the pixel is read out is at least a time period in which the transfer gate transfers a charge of the photoelectric conversion element to the input node of the amplifying unit.

6. The image pickup apparatus according to claim 5,
   wherein a time period in which the second voltage is supplied to the gate of the clipping transistor is longer than the time period in which the transfer gate transfers a charge in the photoelectric conversion element to the input node of the amplifying unit.

7. The image pickup apparatus according to claim 4,
   wherein the pixel further includes a selection transistor, and
   wherein, after the gate of the clipping transistor is supplied with the first voltage in a time period in which the selection transistor is in a conductive state, the gate of the clipping transistor is supplied with the second voltage in a time period in which the transfer gate is in a conductive state and in which a charge in the photoelectric conversion element is being transferred, and the gate of the clipping transistor is supplied with the first voltage after the transfer gate turning to a non-conductive state.

8. A method for driving an image pickup apparatus including a plurality of pixels, each of the plurality of pixels including a photoelectric conversion element, an amplifying unit configured to amplify a signal generated by the photoelectric conversion element, and a transistor whose source or drain is electrically connected to an input node of the amplifying unit, the method comprising:
   switching between a first operation and a second operation, the first operation being configured to supply a first voltage to the gate of the transistor in a time period in which an optical signal in the pixel is read out, the second operation being configured to supply a second voltage that is higher than the first voltage to the gate of the transistor in the time period in which an optical signal in the pixel is read out.

9. The method according to claim 8,
   wherein the first voltage is a voltage configured not to perform a clipping operation when a charge equivalent to a saturation charge of the photoelectric conversion element is transferred to the input node of the amplifying unit, and
   wherein the second voltage is a voltage configured to perform a clipping operation when a charge equivalent to the saturation charge of the photoelectric conversion element is transferred to the input node of the amplifying unit.

10. The method according to claim 8,
    wherein the pixel further includes a transfer gate configured to transfer a charge in the photoelectric conversion element to the input node of the amplifying unit, and a selection transistor, and wherein first to sixth steps are performed in this sequence, the first step being configured to cause the selection transistor to turn to a conductive state, the second step being configured to supply the gate of the transistor with the first voltage after the first step, the third step being configured to supply the gate of the transistor with the second voltage after the second step, the fourth step being configured to cause the transfer gate to turn to a conductive state after the third step while the gate of the transistor is supplied with the second voltage, the fifth step configured to cause the transfer gate to turn to a non-conductive state after the fourth step, and the sixth step configured to supply the gate of the transistor with the first voltage.

11. The image pickup apparatus according to claim 1, wherein while the first voltage is supplied to the gate of the clipping transistor, when the voltage of the input node of the amplifying unit changes from a voltage upon reset to a fourth voltage, the clipping transistor starts clipping, while the second voltage is supplied to the gate of the clipping transistor, when the voltage of the input node of the amplifying unit changes from the voltage upon reset to a fifth voltage, the clipping transistor starts clipping, and an amount of change from the voltage upon reset to the fourth voltage is smaller than an amount of change from the voltage upon reset to the fifth voltage.

12. An image pickup apparatus comprising:
a plurality of pixels, each of the plurality of pixels including a photoelectric conversion element and an amplifying unit configured to amplify a signal generated by the photoelectric conversion element; and
a clipping transistor whose source or drain is electrically connected to an input node of the amplifying unit, configured to be capable of clipping a voltage of the input node of the amplifying unit,
wherein a gate of the clipping transistor receives a first voltage in one period in which an optical signal in the photoelectric conversion element is read out to the input node of the amplifying unit, and receives a second voltage higher than the first voltage in another period in which an optical signal in the photoelectric conversion element is read out to the input node of the amplifying unit.

13. The image pickup apparatus according to claim 12, wherein the gate of the clipping transistor receives a third voltage that is higher than the second voltage in an another period in which the amplifying unit reads out the optical signal in the photoelectric conversion element is read out to the input node of the amplifying unit.

14. The image pickup apparatus according to claim 12, wherein the pixel further includes a transfer gate configured to transfer a charge in the photoelectric conversion element to the input node of the amplifying unit.

15. The image pickup apparatus according to claim 14, wherein each period in which the first and the second voltage is supplied to the gate of the clipping transistor is longer than a time period in which the transfer gate transfers the charge in the photoelectric conversion element to the input node of the amplifying unit.

16. The image pickup apparatus according to claim 12, wherein the pixel further includes a selection transistor, and
wherein, after the gate of the clipping transistor is supplied with the first voltage in a time period in which the selection transistor is in a conductive state, the gate of the clipping transistor is supplied with the second voltage in a time period in which the transfer gate is in a conductive state and in which a charge in the photoelectric conversion element is transferred, and the gate of the clipping transistor is supplied with the first voltage after the transfer gate turns to a non-conductive state.

17. The image pickup apparatus according to claim 12, wherein while the first voltage is supplied to the gate of the clipping transistor, when the voltage of the input node of the amplifying unit changes from a voltage upon reset to a fourth voltage, the clipping transistor starts clipping, while the second voltage is supplied to the gate of the clipping transistor, when the voltage of the input node of the amplifying unit changes from the voltage upon reset to a fifth voltage, the clipping transistor starts clipping, and
an amount of change from the voltage upon reset to the fourth voltage is smaller than an amount of change from the voltage upon reset to the fifth voltage.

18. An image pickup apparatus comprising:
a plurality of pixels, each of the plurality of pixels including a photoelectric conversion element and an amplifying unit configured to amplify a signal generated by the photoelectric conversion element; and
a clipping transistor whose source or drain is electrically connected to an input node of the amplifying unit, configured to be capable of clipping a voltage of the input node of the amplifying unit,
wherein a gate of the clipping transistor receives a first voltage in one period in which an optical signal in the photoelectric conversion element is read out to the input node of the amplifying unit, and receives a second voltage different from the first voltage in another period in which the optical signal in the photoelectric conversion element is read out to the input node of the amplifying unit;
while the first voltage is supplied to the gate of the clipping transistor, when the voltage of the input node of the amplifying unit changes from a voltage upon reset to a fourth voltage, the clipping transistor starts clipping;
while the second voltage is supplied to the gate of the clipping transistor, when the voltage of the input node of the amplifying unit changes from the voltage upon reset to a fifth voltage, the clipping transistor starts clipping; and
an amount of change from the voltage upon reset to the fourth voltage is smaller than an amount of change from the voltage upon reset to the fifth voltage.

19. A method for driving an image pickup apparatus including a plurality of pixels, each of the plurality of pixels including a photoelectric conversion element, an amplifying unit configured to amplify a signal generated by the photoelectric conversion element, and a clipping transistor whose source or drain is electrically connected to an input node of the amplifying unit, the method comprising:
supplying a first voltage to a gate of the clipping transistor in one period in which an optical signal in the photoelectric conversion element is read out to the input node of the amplifying unit, and
supplying a second voltage higher than the first voltage to the gate of the clipping transistor in another period in which the optical signal in the photoelectric conversion element is read out to the input node of the amplifying unit.

* * * * *